United States Patent [19]

Roza

[11] 4,039,967
[45] Aug. 2, 1977

[54] PHASE-LOCKED LOOP HAVING A SLIGHT PHASE OFFSET ERROR

[75] Inventor: Engel Roza, Eindhoven, Netherlands

[73] Assignee: U.S. Philips Corporation, New York, N.Y.

[21] Appl. No.: 657,558

[22] Filed: Feb. 12, 1976

[30] Foreign Application Priority Data

Feb. 18, 1975 Netherlands ............................ 7501871

[51] Int. Cl.² .............................................. H03B 3/04
[52] U.S. Cl. ........................................ 331/11; 329/204; 331/26; 332/18
[58] Field of Search ............... 331/26, 11, 12; 332/18, 332/19; 329/138–143, 204; 328/155, 133, 134

[56] References Cited

U.S. PATENT DOCUMENTS

2,838,673   6/1958   Fernsler et al. ...................... 329/142

Primary Examiner—John Kominski
Attorney, Agent, or Firm—Frank R. Trifari; Daniel R. McGlynn

[57] ABSTRACT

A phase-locked loop circuit in which the phase offset error arising from imperfections in the balance of the phase comparator is reduced to a minimum by a special construction of the phase comparator. The quasi-static phase error of the loop is then reduced to very low values so that the loop is particularly suited for recovering the clock frequency from synchronous pulse signals having clock frequencies of several hundred MHz.

1 Claim, 8 Drawing Figures

PHASE-LOCKED LOOP HAVING A SLIGHT PHASE OFFSET ERROR

The invention relates to a phase-locked loop comprising a voltage controlled reference circuit having a natural frequency, a phase comparator for producing an output voltage in response to a difference in phase between an input signal and a reference signal derived from said reference circuit, a loop filter connected to said phase comparator for applying said output voltage to said reference circuit for controlling said natural frequency, said phase comparator including an input circuit for combining said reference signal with said input signal to form a first composite signal and for combining said reference signal in the opposite phase with said input signal to form a second composite signal, first and second diode peak detectors connected in a balanced manner and producing first and second detection currents respectively in response to said first and said second composite signals respectively, said first and second diode peak detectors jointly producing a detecting voltage proportional to the difference between said first and said second detection current. In the majority of applications the reference circuit is a voltage-controlled oscillator in which the phase-locked loop is used to render the oscillator frequency exactly equal to the frequency of the input signal. There are, however, also applications in which the reference circuit is constituted by a passive resonant circuit having a voltage-controlled element, frequency a capacitor, in which the phase-locked loop is used to render the difference between the resonant frequency and the frequency of the input signal as small as possible.

The phase-locked loop set forth above utilizes a known type of balanced phase comparator which is equipped with diodes, inter alia, because the frequency range in which desired properties are preserved is considerably larger for diodes than that for comparable transistors. In practice, it is found that the output voltage of this phase comparator is not exclusively determined by the difference in phase between the input signal and the reference signal, but is also affected by imperfections in the balance arising because of differences between the elements, particularly the diodes, differences between the values and the waveforms of the reference signals in the two opposite phases, and variations in the input signal. These influences give rise to a varying offset voltage in the output voltage of the phase comparator which offset voltage does not disappear when the phase difference between the input signal and the reference signal is zero. This offset voltage in turn produces an extra phase offset error between the input signal and the reference signal. In many applications no special requirements are imposed on the total quasi-static phase error between input signal and reference signal, to which error the extra phase offset error contributes to a considerable extent, and consequently this extra phase offset error can be left out of consideration in the design of the phase-locked loop.

However, for some applications there is a practical need for a phase-locked loop having a minimum total quasi-static phase error. This is particularly the case in transmission systems for synchronous pulse signals in which the clock frequency is recovered from the received pulse signals for pulse regeneration. To keep the loss in signal-to-noise ratio which occurs in pulse regeneration within acceptable limits, the total quasi-static phase error must not exceed approximately 0.1 rad. In practice, such a low value cannot be achieved even when making use of the known technique for reducing the quasi-static phase error by increasing the velocity constant of the phase-locked loop.

It is an object of the invention to provide a phase-locked loop of the type set forth in the preamble in which the phase offset error arising because of imperfections in the balance of the phase comparator is reduced to a minimum and very low values of the total quasi-static phase error can be achieved so that this phase-locked loop is particularly suited for recovering the clock frequency from synchronous pulse signals having very high clock frequencies.

According to the invention the phase-locked loop is characterized in that said phase comparator further includes third and fourth diode peak detectors connected in a balanced manner and producing third and fourth detection currents respectively in response to said reference signal and said reference signal in the opposite phase, respectively, said third and fourth diode peak detectors jointly producing a compensation voltage proportional to the difference between said third and said fourth detection current, said phase comparator also including an output circuit for differentially combining said detection voltage with said compensation voltage so as to produce said phase comparator output voltage substantially free from offset voltages.

The invention and its advantages will now be described with reference to the various Figures of the drawings.

Figure 1:
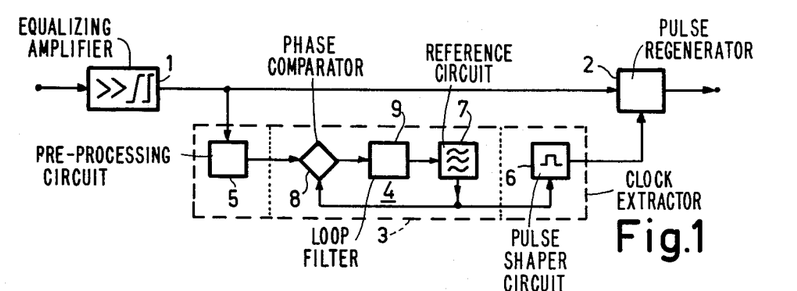
FIG. 1 is a block diagram of regenerative repeater for synchronous pulse signals in which a phase-locked loop is used for recovering the clock frequency.

FIG. 1 is a block diagram of a regenerative repeater in a transmission system for pulse signals of fixed clock frequency, for example, PCM-signals having polar pulses and a clock frequency of several hundred MHz. The repeater comprises an equalizing amplifier 1 for amplifying the received pulse signals and for equalizing the amplitude and phase characteristics of the preceding transmission path, and a pulse regenerator 2 for regenerating the received signal pulses in the correct form and of the correct instants. The pulse regenerator 2 is connected to a clock extractor 3 which recovers the clock frequency for controlling the pulse regenerator 2 from the received pulse signals by means of a frequency selective circuit 4. The bandwidth of the received pulse signals is usually limited to such an extent that no component of clock frequency occurs therein. This means that a non-linear pre-processing circuit 5 is required in the clock extractor 3 in order to obtain a signal having a component of clock frequency, which component is selected by means of frequency-selective circuit 4 and is applied to a pulse shaper circuit 6 in order to obtain clock pulses having the shape and phase required for pulse regeneration. Several actual constructions are known for the repeater of FIG. 1. These are, however, unimportant in the present context in so far as they do not relate to the frequency-selective circuit 4.

In FIG. 1 a frequency-selective circuit 4 in the form of a phase-locked loop is used. This loop comprises a reference circuit 7 in the form of a voltage-controlled oscillator whose natural frequency is substantially equal to the clock frequency, a phase comparator 8 for generating an output voltage in response to the occurrence of a difference in phase between the clock frequency component in the input signal derived from pre-processing circuit 5 and a reference signal derived from oscillator 7, and a first-order loop filter 9 through which the output voltage of phase comparator 8 is applied to oscillator 7 so as to render the oscillator frequency exactly equal to the clock frequency.

Figure 2:
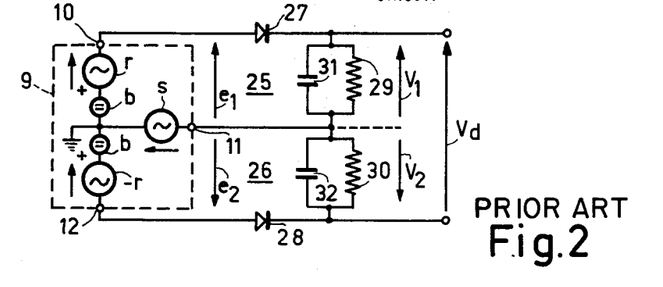
FIG. 2 shows the structure of a known phase comparator which can be used in the phase-locked loop of FIG. 1.

In view of the very high clock frequency used a phase comparator 8 equipped with diodes is used in the phase-locked loop 4 of FIG. 1. A possible construction for such a diode phase comparator 8 is shown in FIG. 2. In general terms this phase comparator has an input circuit 9 for combining the reference signal $r$ derived from oscillator 7 with the input signal $s$ derived from pre-processing circuit 5 to produce a first composite signal $e_1$ which occurs between outputs 10 and 11, and for combining the reference signal in the opposite phase $-r$ with the input signal $s$ to produce a second composite signal $e_2$ which occurs between outputs 12 and 11. For the sake of simplicity it has been assumed in FIG. 2 that the two reference signals $r$, $-r$ and the input signal $s$ originate from voltage sources.

Figure 3:
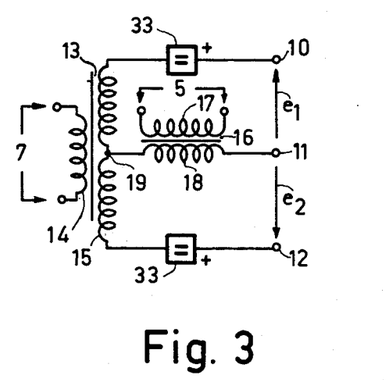
FIG. 3 and FIG. 4 show possible constructions of the input circuit of the phase comparator of FIG. 2.
Figure 4:
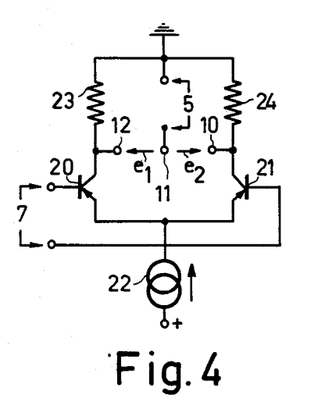

FIG. 3 and FIG. 4 show two possible constructions for the input circuit 9 of FIG. 2. The input circuit shown in FIG. 3 comprises a transformer 13 having a primary winding 14 connected to oscillator 7 of FIG. 1, and a secondary winding 15 whose ends are connected to outputs 10 and 12. This input circuit also comprises a transformer 16 having a primary winding 17 connected to pre-processing circuit 5 of FIG. 1, and a secondary winding 18 connected between a centre tap 19 on the secondary winding 15 of transformer 13 and output 11. The input circuit shown in FIG. 4 does not use transformers and is therefore attractive when it is desired to construct the phase comparator as a monolithic integrated circuit. The input circuit in FIG. 4 includes two transistors 20, 21 whose emitters are connected to a current source 22 and whose collectors are connected to a point of fixed potential (earth or ground) via two resistors 23, 24 of equal value. The bases of transistors 20, 21 are connected to oscillator 7 of FIG. 1 and their collectors are connected to outputs 12 and 10 respectively, while pre-processing circuit 5 of FIG. 1 is connected between output 11 and the point of fixed potential.

The phase comparator of FIG. 2 also includes first and second diode peak detectors 25, 26 connected in a balanced manner, which detectors produce first and second detection currents respectively in response to the first and the second composite signals $e_1$ and $e_2$ respectively and jointly produce a detection voltage $V_d$ which is proportional to the difference between the first and the second detection current. In the circuit of FIG. 2 the diode peak detectors 25, 26 are connected in the same manner as in the phase comparator of the known Foster-Seeley FM-discriminator. The peak detectors 25, 26 include two diodes 27, 28 which are connected in the same sense between the outputs 10, 12 of input circuit 9 and one end of two identical parallel combinations of resistors 29, 30 and capacitors 31, 32. The other ends of these parallel combinations 29, 31 and 30, 32 are connected together and this common point is connected to output 11 of input circuit 9.

Silicon diodes, for example in the form of Schottky-barrier diodes, are preferably used in the phase comparator of FIG. 2 because of their very favourable high-frequency properties. Since silicon diodes have a fairly high threshold voltage, input circuit 9 has to apply a suitable bias $b$ to the two diodes 27, 28 and in FIG. 2 it has been assumed that the two biases $b$ originate from voltage sources. To this end a separate bias source 33 has to be provided in the circuit of FIG. 3 which source may, however, be omitted in the circuit of FIG. 4 because the supply voltage drop across the collector resistors 23 and 24 can be used.

The operation of the phase comparator of FIG. 2 will now be described further. For the sake of simplicity it will be assumed that the reference signal $r$ and the input signal $s$ are both sinusoidal. These signals may be represented by:

$$r = R \sin\omega t \quad (1)$$
$$s = S \cos(\omega t + \theta) \quad (2)$$

A cosine function has been chosen for $s$ for convenience because in the nominal state of a phase-locked loop there is a phase difference of $\pi/2$ rad. between the input signal and reference signal. It has also been assumed for convenience that the threshold voltage of the two diodes 27, 28 and hence their bias $b$ is equal to zero so that the composite signals $e_1$ and $e_2$ may be represented by:

$$e_1 = s + r \quad (3)$$
$$e_2 = s + r \quad (4)$$

Figure 5:
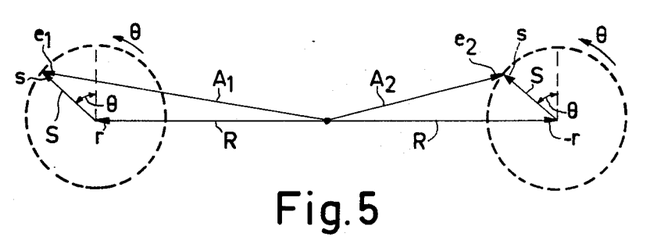
FIG. 5 is a vector diagram for explaining the operation of the phase comparator of FIG. 2.

Their vector relationship is shown in FIG. 5 in which the circles with radius S depict how the signals $e_1$ and $e_2$ vary when the phase difference $\theta$ between input signal $s$ and reference signal $r$ varies from 0 to $2\pi$ rad. If it is also assumed for convenience that the detection efficiency $\eta$ of the two peak detectors 25, 26 is equal to 1 their output voltages will be equal to the amplitudes $A_1$ and $A_2$ of the signals $e_1$ and $e_2$, from which it follows from FIG. 5 that:

$$A_1^2 = R^2 + S^2 + 2RS \sin\theta \quad (5)$$
$$A_2^2 = R^2 + S^2 - 2RS \sin\theta \quad (6)$$

The detection voltage $V_d$ is then equal to the difference between these amplitudes $A_1$ and $A_2$ and may be written with the aid of formulas (5) and (6) as:

$$V_d = A_1 - A_2 = 4 RS/A_1 + A_2 \sin\theta \quad (7)$$

In practice the reference signal will be much larger than the input signal, hence R>S so that to a satisfactory approximation:

$$A_1 + A_2 = 2R(1 + S^2/2R^2) \quad (8)$$

and the formula (7):

$$V_d = 2S(1 - S^2/2R^2) \sin\theta \quad (9)$$

This ideal state with a phase comparator completely in balance cannot of course be achieved in practice. This is not only because of differences between the elements, particularly between the diodes, but also because of differences between the values and the waveforms of the reference signals in the two opposite phases, differences between the biases on the diodes and variations in the level of the input signal. Moreover, the detection efficiency of the peak detectors, which is always less than 1 in practice, is not the same for both peak detectors owing to these differences.

These differences affect the detection voltage $V_d$ in a very intricate manner, but a satisfactory description of their effect can be obtained by assuming that the two reference signals only differ in amplitude and by assuming that the effect of the other said influences combined with that of this amplitude difference can be represented by a difference in detection efficiency of the two peak detectors. This means that, instead of reference signals $r$, $-r$ given by formula (1), reference signals $r'$, $-r''$ now occur which ae given by:

$$r' = R(1 + D)\sin\omega t \quad (10)$$
$$-r'' = -R(1 - D)\sin\omega t \quad (11)$$

where D is one order of magnitude less than 1. The composite signals $e_1$ and $e_2$ are then:

$$e_1 = s + r' \quad (12)$$
$$e_2 = s - r'' \quad (13)$$

and their amplitudes $B_1$ and $B_2$ are given by (compare formulas (5) and (6):

$$B_1^2 = R^2(1 + D)^2 + S^2 + 2RS(1 + D)\sin\theta \quad (14)$$
$$B_2^2 = R^2(1 - D)^2 + S^2 - 2RS(1 - D)\sin\theta \quad (15)$$

In general the detection efficiency of peak detector 25 will be different from that of peak detector 26 and it is possible to write for the output voltages $V_1$ and $V_2$:

$$V_1 = \eta(1 + \delta)B_1 \quad (16)$$
$$V_2 = \eta(1 - \delta)B_2 \quad (17)$$

Where $\eta$ is the mean value of the detection efficiencies and $\delta$ is one order of magnitude less than 1. The detection voltage $V_d$ is given by:

$$V_d = V_1 - V_2 \quad (18)$$

If the reference signals are much larger than the input signal and the said order of magnitude of the differences is taken into account, it follows from formulas (14) – (18) that the detection voltage $V_d$ is given to a satisfactory approximation by:

$$V_d = 2\eta S(1-S^2/2R^2)\sin\theta + 2\eta R[(1+S^2/2R^2)\delta + (1-S^2/2R^2)D] \quad (19)$$

This shows clearly that the detection voltage $V_d$ at the output of the phase comparator in FIG. 2 includes an offset voltage which does not disappear when the phase difference $\theta$ between input signal and reference signal is zero.

Due to the voltage offset the phase comparator of FIG. 2 detects a phase difference $(\theta + \phi)$ between input signal and reference signal instead of the actual phase difference $\theta$. Provided that the phase differences are small relative to 1 rad. the phase error $\phi$ caused by the voltage offset can be derived direct from formula (19) which may then be written as:

$$V_d = 2\eta S(1-S^2/2R^2)[\theta + R(\delta+D)/S + S\delta/R] = K_d(\theta + \phi) \quad (20)$$

in which:

$$K_d = 2\eta S(1 - S^2/2R^2) \quad (21)$$

can be considered as the gain factor of the phase comparator with the dimension of volt per rad. It follows from formula (20) that:

$$\phi = R(\delta+D)/S + S\delta/R \approx R(\delta+D)/S \quad (22)$$

When the phase comparator of FIG. 2 is used in the phase-locked loop 4 of FIG. 1 the voltage offset in phase comparator 8 gives rise to an extra phase offset error between input signal and reference signal which is likewise given by formula (22). This may be seen as follows. In the open loop the offset voltage $K_d\phi$ of phase comparator 8 results in a voltage $K_dF(o)\phi$ at the output of loop filter 9 where F(o) is the dc gain of loop filter 9. This voltage produces a frequency variation:

$$K_dF(o)K_o\phi = K_v\phi \quad (23)$$

in voltage-controlled oscillator 7, where $K_o$ is the gain constant of oscillator 7 with the dimension of rad. per sec. per volt and $K_v$ is known as the velocity constant of the loop with the dimension of $(sec)^{-1}$. In addition, oscillator 7 already has a frequency difference of $\Delta\omega_o$ relative to the clock frequency in the absence of an output voltage from phase comparator 8 so that the total frequency difference $\Delta\omega$ with the loop open is given by:

$$\Delta\omega = \Delta\omega_o + K_v\phi \quad (24)$$

When the loop is closed $\Delta$ results in a total quasi-stataic phase error $\phi_{eo}$ which is given by:

$$\phi_{eo} = \Delta\omega/K_v = (\Delta\omega_o/K_v) + \phi \quad (25)$$

The offset voltage $K_d\phi$ of phase comparator 8 thus produces an extra phase offset error $\phi$ between input signal and reference signal which is given by formula (22) and which according to formula (25) is independent of the velocity constant $K_v$ of the phase-locked loop.

Difficulties caused by a phase error $\phi$ which depends only on constant differences between the components of phase comparator 8 (including its input circuit) and their interconnections are not insurmountable because the then constant error $\phi$ can be compensated for by deliberately bringing about a corresponding detuning of oscillator 7 with the aid of an alignment circuit, although the provision of such a circuit with a sufficient control range may have drawbacks. It is a much more serious fact that in practice the differences between the components and their interconnections do not remain constant, but vary due to temperature, moisture and ageing and that the variations $\Delta\phi$ caused thereby in the phase error $\phi$ cannot be compensated for by alignment.

In the regenerative repeater of FIG. 1 phase-locked/-loop 4 is used to recover the clock frequency from the received pulse signals for controlling pulse regenerator 2. Since any phase error in the recovered clock frequency implies a reduction in the signal-to-noise ratio in pulse regeneration, a phase-locked loop 4 is required which has a minimum quasi-static phase error $\theta_{eo}$ so as to keep this reduction within acceptable limits. Generally a value of approximately 0.1 rad. is considered to be acceptable. Even if phase-locked loop 4 is equipped with a crystal-stabilized voltage-controlled oscillator 7 and a high value of the velocity constant is chosen in addition, so that the term $(\Delta\omega_o/K_v)$ can be left out of consideration in formula (25), this low value of quasi-static phase error $\theta_{eo}$ cannot be achieved owing to the variations $\Delta\phi$ in the phase offset error $\phi$ which are produced by the variations in the offset voltage at the output of phase comparator 8. It follows from formulas (22) and (25) that, even when the constant value of $\phi$ is compensated for, there are still variations $\Delta\phi$ which certainly have to satisfy the condition:

$$\Delta\phi = \Delta\{R(\delta + D)/S\} < 0.1 \text{ rad.} \tag{26}$$

Since the reference signals are in practice much larger than the input signal, small variations in the differences in detection efficiency and the differences in amplitude of the reference signals already yield a much larger value for $\Delta\phi$ than is acceptable according to formula (26). For example, a variation of 5% in the difference in detection efficiency ($\Delta\delta = 0.025$) and a variation of 3% in the amplitude difference between the reference signals ($\Delta D = 0.015$) at a value $R/S = 5$ results in a variation $\Delta\phi$ 0.2 rad. in the phase offset error $\phi$.

The above considerations make it clear that the phase offset error arising because of the voltage offset in the diode phase comparator is a considerable hindrance when using a phase-locked loop in a regenerative repeater for pulse signals having clock frequencies of several hundred MHz. Using a phase comparator in the form of a known balanced multiplier equipped with transistors, which has favourable properties in this respect at low frequencies, does not provide a way out at these high clock frequencies, because it can be proved that the requirements imposed on the transistors are more stringent than those which can be achieved with the best transistors currently available, with the result that the phase offset error would be larger than the obtained with the diode phase comparator described.

According to the invention a phase-locked loop 4 is obtained in which the phase offset error $\phi$ arising because of imperfections in the balance of diode phase comparator 8 is reduced to very low values. To this end this loop includes a phase comparator 8 which, as shown in FIG. 6, includes a third and a fourth diode peak detector 34, 35 connected in a balanced manner, which detectors produce third and fourth detection currents respectively in response to the reference signal derived from oscillator 7 and to the reference signal in the opposite phase respectively, and jointly produce a compensation voltage $V_c$ proportional to the difference between the third and the fourth detection current; the phase comparator also includes an output circuit 36 for differentially combining the detection voltage $V_d$ with the compensation voltage $V_c$ to produce a phase comparator output voltage $V_{d,c}$ which is substantially free from offset voltages.

Figure 6:
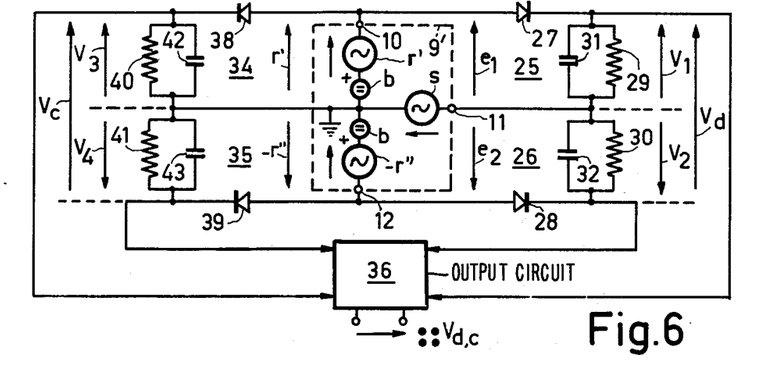
FIG. 6 shows the structure of a phase comparator which is used in the phase-locked loop according to the invention.

As regards the structure and operation of input circuit 9′ and diode peak detectors 25, 26 the circuit of FIG. 6 corresponds exactly to that of FIG. 2. The diode peak detectors 34, 35 are, moreover, connected in the same manner as diode peak detectors 25, 26; they include two diodes 38, 39 which are connected in the same sense between the outputs 10, 12 of input circuit 9′ and one end of two identical parallel arrangements of resistors 40, 41 and capacitors 42, 43. The other ends of these parallel arrangements 40, 42 and 41, 43 are connected together but in contradistinction to the peak detectors 25, 26, this common point is connected to a point of fixed potential (earth or ground).

The operation of the phase comparator of FIG. 6 will now be described further, making the same assumptions that were made for the phase comparator of FIG. 2 in order to obtain the effect of the imperfections in the balance. This means that composite signals $e_1$ and $e_2$ defined by formulas (12) and (13) are applied to peak detectors 25 and 26, and reference signals $r'$ and $r''$ defined by formulas (10) and (11) are applied to peak detectors 34 and 35. Since the signals which are applied to peak detectors 25, 34 and 26, 35 only differ in that the input signal is absent in the signal applied to peak detectors 34 and 35, and since in practice this input signal is small relative to the reference signals, it can be assumed to a satisfactory approximation that the effect of the absence of this input signal at the two peak detectors 34, 35 is a very small and equal decrease of their deflection efficiencies relative to those of peak detectors 25, 26. Their output voltages $V_3$ and $V_4$ can then be written as:

$$V_3 = (1 - \epsilon) \eta (1 + \delta) R (1 + D) \tag{27}$$
$$V_4 = (1 - \epsilon) \eta (1 - \delta) R (1 - D) \tag{28}$$

in which $\epsilon$ is one order of magnitude less than 1. The compensation voltage $V_c$ is therefore given by:

$$V_c = V_3 - V_4 = 2\eta R(1 - \epsilon)(\delta + D) \tag{29}$$

By subtracting this compensation voltage $V_c$ from the detection voltage $V_d$ given by formula (19) by means of output circuit 36 a phase comparator output voltage is obtained which is given by:

$$V_{d,c} = V_d - V_c = 2\eta S(1 - S^2/2R^2)\sin\phi + 2\eta R(\epsilon + S^2/2R^2)\delta + 2\eta R(\epsilon - S^2/2R^2) D. \tag{30}$$

In this way the steps described result in a consideration reduction of the voltage offset at the output of the phase comparator of FIG. 6 and hence in a considerable reduction of the extra phase offset error $\phi'$, caused thereby between input signal and reference signal in the phase-locked loop of FIG. 1. Under the same conditions as those for which formula (22) is derived from formula (19) the following relation for the residual phase error $\phi'$ can be derived from formula (30):

$$\phi' = (\epsilon - S^2/2R^2) R (\delta+D)/S + S\delta/R \tag{31}$$

where $S^2/2R^2$ is neglected, compared with 1.

The differences in efficiency and in the values of the reference signals thus have a much smaller influence on the phase error $\phi'$ given by formula (31) than on the phase error $\phi$ given by formula (22). The same applies to the variations $\Delta\phi'$ in $\phi'$ as compared with the variations $\Delta\phi$ in $\phi$. When the condition given by formula (26) is also imposed on $\Delta\phi'$ and when the values $\Delta\delta = 0.025$, $\Delta D = 0.015$ and $R/S = 5$ are again chosen, even the relatively high value $\epsilon = 0.1$ only results in a variation $\Delta\phi' = 0.021$ rad. in the phase error $\phi'$ so that the condition $\Delta\phi' < 0.1$ rad. is amply satisfied.

The already small phase error $\phi'$ may be reduced even further by increasing the amplitudes R and S while maintaining the ratio R/S constant. For an increasing amplitude of the signal applied to the peak detector the detection efficiency increases to an ever slower extent and approaches the constant value 1 asymptotically for large amplitudes so that the value of $\epsilon$ will become smaller and smaller for increasing values of R and S with the ratio R/S constant. It follows from formula (31) that the phase error $\phi'$ will also then become smaller and smaller and will asymptotically approach the value:

$$\phi'' = S(\delta - D)/2R \qquad (32)$$

The variations $\Delta\phi''$ are given by:

$$\Delta\phi'' = \Delta\{S(\delta - D)/2R\} \qquad (33)$$

As compared with formula (26) the influence $\Delta\phi''$ which variations of the difference in detection efficiency ($\Delta \delta$) and variations of the amplitude difference between the reference signals ($\Delta D$) have on the phase error $\phi''$ has been reduced by a factor $S^2/2R^2$; for $R/S = 5$ this factor has the value 50. If the absence of the input signal in the signal applied to peak detectors 34, 35 of FIG. 6 results in a relatively large reduction of their detection efficiency relative to that of peak detectors 25, 26, a sufficiently low value of both phase error $\phi'$ and variations $\Delta\phi'$ can always be obtained by increasing the amplitudes of the reference signal and the input signal while maintaining their amplitude ratio constant.

It has been assumed above that the diodes 27, 28, 38, 39 of FIG. 6 match. Since the four Schottky-barrier diodes used in this case are currently available integrated in a single semiconductor body, a satisfactory match can be reasonably ensured in practice.

The output circuit 36 may be formed in various known ways, the only important requirement being that the required differential combination of the detection voltage $V_d$ and the compensation $V_c$ does not deteriorate owing to imperfections in the output circuit 36 itself. Since the voltages to be processed are low in frequency as compared with the clock frequency, the output circuit 36 can easily be made up from known transistor circuits which have proved to be quite reliable in this respect.

Figure 7:
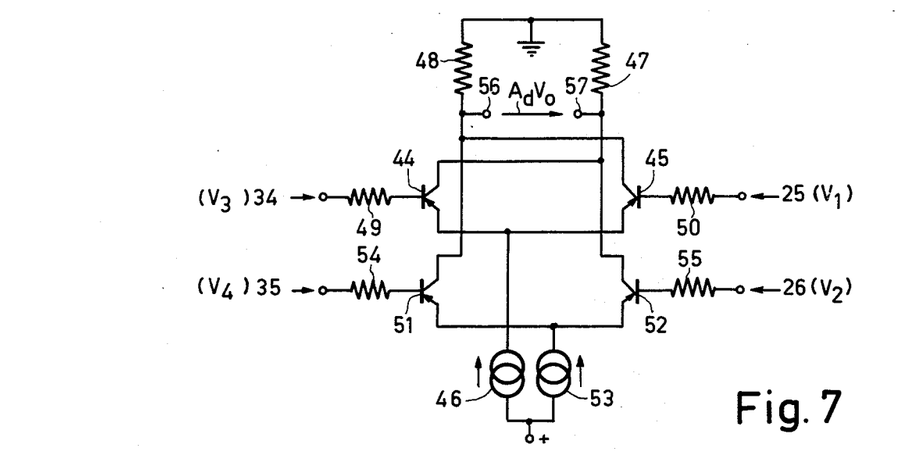
FIG. 7 shows a possible construction of the output circuit of the phase comparator of FIG. 6.

FIG. 7 shows a possible construction of such an output circuit. This circuit includes two transistors 44, 45 whose emitters are connected to a first current source 46 and whose collectors are connected to point of fixed potential (earth or ground) via two resistors 47, 48 of equal value. The bases of transistors 44, 45 are connected via two resistors 49, 50 of equal value to the output of the third peak detector 34 and the first peak detector 25, respectively, of FIG. 6 and thus receive the voltages $V_3$ and $V_1$, respectively. The circuit of FIG. 7 also includes two transistors 51, 52 whose emitters are connected to a second current source 53 and whose collectors are connected to the point of fixed potential via the same resistors 47, 48 as the collectors of transistors 44, 45 but in such manner that resistor 47 is connected to the collectors of transistors 44 and 52 and resistor 48 is connected to the collectors of transistors 45 ans 51. The bases of transistors 51, 52 are connected through two resistors 54, 55 of equal value to the resistors 59, 50 to the output of the fourth peak detector 35 and the second peak detector 26, respectively, of FIG. 6 and thus receive the voltages $V_4$ and $V_2$, respectively. The ends of resistors 47, 48 connected to the transistors are connected to outputs 56, 57 between which a voltage $A_dV_o$ occurs, where $A_d$ is the gain factor of the output circuit and $V_o$ is given by:

$$V_o = V_1 - V_2 - V_3 + V_4 = (V_1 - V_2) - (V_3 - _4) \qquad (34)$$

for which, from formulas (18), (29) and (30), there applies that:

$$V_o = V_d - V_c = V_{d,c} \qquad (35)$$

The gain factor $A_d$ is equal to that of the two push-pull amplifiers in which it is assumed that the transistors 44, 45 and 51, 52 constitute matching pairs and that possible small differences between the pairs owing to correspondingly different adjustments of the current sources 46 and 53 do not lead to differences between the gain factors of the two push-pull amplifiers. Of course the voltages $V_2$ and $V_3$ of FIG. 7 can be interchanged so that $V_2$ is present at the base of transistors 44 and $V_3$ is present at the base of transistor 52 without this interchange having any influence on the voltage between outputs 56 and 57. The manner of connection preferred is dependent on the way in which the diodes in FIG. 6 have to be combined to produce well-matching pairs if there are small differences between the diodes.

Thus the use of the steps according to the invention makes it possible to reduce the phase offset error owing to imperfections in the balance of the phase comparator to a minimum so that very low values of the total quasi-static phase error can be achieved in the phase-locked loop, provided that the other contribution ($\Delta\omega_o/K_v$) to this error is made sufficiently small by a satisfactory design of the loop. It has been found, for example, that in a practical embodiment of the repeater of FIG. 1 a total quasi-static phase error of less than 0.1 rad. can easily be achieved for pulse signals with a clock frequency of 420 MHz when using a phase comparator according to FIG. 6 in the phase-locked loop 4.

Figure 8:
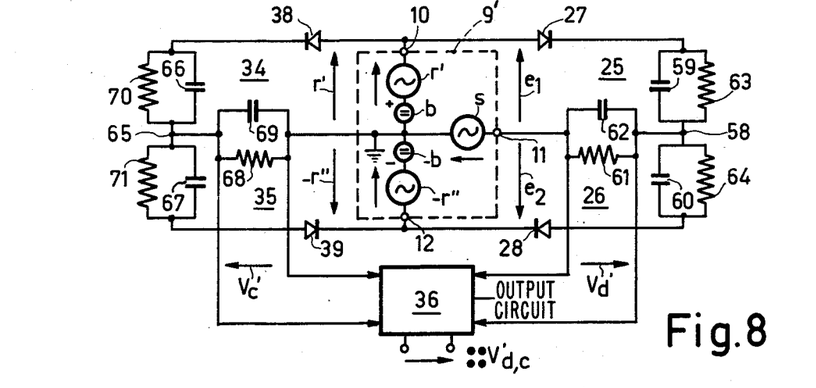
FIG. 8 shows a modification of the phase comparator of FIG. 6.

In the circuits of FIG. 2 and FIG. 6 peak detectors 25, 26 in the phase comparator are connected in the same manner as in the phase discriminator of the known Foster-Seeley FM-discriminator, and the same applies to peak detectors 34, 35 of FIG. 6. However, the steps according to the invention may also be used for other constructions of diode phase comparator 8 in the phase-locked loop 4 of FIG. 1. FIG. 8 shows by way of example a modification of FIG. 6 in which peak detectors 25, 26 and 34, 35 are connected in the same manner as in the known Ratio-detector which is frequently used in FM-receivers.

In FIG. 8 diodes 27, 38 are connected in the same sense as in FIG. 6 to output 10 of input circuit 9, but diodes 28, 39 are connected in the reverse sense to output 12 of input circuit 9' as compared with FIG. 6 so that the polarity of the associated bias source must also be reversed. In peak detectors 25, 26 diodes 27, 28 are coupled together through two series-arranged capacitors 59, 60 of equal value whose common point 58 is connected to one end of a parallel arrangement of a resistor 61 and a capacitor 62, while the other end of this parallel arrangement 61, 62 is connected to output 11 of input circuit 9'. The two capacitors 59, 60 are shunted by two resistors 63, 64 of equal value so as to obtain a closed dc path for each of the peak detectors 25, 26. Due to the reversal of diode 28 a detection voltage $V_d'$ occurs across resistor 61, which voltage is proportional to the difference between the detection currents but is smaller than the detection voltage $V_d$ of the equivalent phase comparator of FIG. 6. Likewise diodes 38, 39 in peak detectors 34, 35 are coupled together through two series-arranged capacitors 66, 67 of equal value whose common point 65 is connected to one end of a parallel arrangement of a resistor 68 and a capacitor

69, while the other end of this parallel arrangement 68, 69 is, however, connected to a point of fixed potential (earth or ground). The two capacitors 66, 67 are shunted by two resistors 70, 71 of equal value so as to obtain a closed dc path for each of the peak detectors 34, 35. A compensation voltage $V_c'$ then occurs across resistor 68, which voltage is proportional to the difference between the detection currents but which is much smaller than the compensation voltage $V_c$ of the equivalent phase comparator of FIG. 6. The voltages $V_d'$ and $V_c'$ are differentially combined in output circuit 36 to produce a phase comparator output voltage $V'_{d,c}$ which is also small compared with that obtained with the circuit of FIG. 6.

There are no essential differences between the operation of the phase comparators of FIG. 6 and FIG. 8. In practice the phase comparator of FIG. 6 is, however, preferred to that of FIG. 8, inter alia, because of the smaller voltages ocurring in FIG. 8 relative to those in FIG. 6 and the less simple input circuit of FIG. 8 which includes two bias sources of opposite polarity.

What is claimed is:

1. A phase-locked loop comprising
   a voltage-controlled reference circuit having a natural frequency;
   a phase comparator for producing an output voltage in response to a difference in phase between an input signal and a reference signal derived from said reference circuit;
   a loop filter connected to said phase comparator for applying said output voltage to said reference circuit for controlling said natural frequency;
   said phase comparator including an input circuit for combining said reference signal with said input signal to form a first composite signal and for combining said reference signal in the opposite phase with said input signal to form a second composite signal;
   first and second diode peak detectors connected in a balanced manner and producing first and second detection currents respectively in response to said first and said second composite signals respectively;
   said first and second diode peak detectors jointly producing a detection voltage porportional to the difference between said first and said second detection current;
   third and fourth diode peak detectors connected in a balanced manner and producing third and fourth detection currents respectively in response to said reference signal and said reference signal in the opposite phase, respectively;
   said third and fourth diode peak detectors jointly producing a compensation voltage proportional to the difference between said third and said fourth proportional to the difference between said third and said fourth detection current; and
   said phase comparator also including an output circuit for differentially combining said detection voltage with said compensation voltage so as to produce said phase comparator output voltage substantially freee from offset voltages.

* * * * *

UNITED STATES PATENT AND TRADEMARK OFFICE
CERTIFICATE OF CORRECTION

PATENT NO. : 4,039,967

DATED : August 2, 1977

INVENTOR(S) : ENGEL ROZA

It is certified that error appears in the above-identified patent and that said Letters Patent are hereby corrected as shown below:

Column 5, line 19, "ae" should be --are-- line 30, "(6)" should be --(6) )--

Column 6, line 37, "$\emptyset_{eo}$" should be --$\theta_{eo}$-- line 39, "$\emptyset_{eo} = \Delta\omega/K_v = (\Delta\omega_o/K_v) + \emptyset$" should be --$\theta_{eo} = \Delta\omega/K_v = (\Delta\omega_o/K_v) + \emptyset$--

Column 7, line 24, "$\Delta\emptyset\ 0.2$ rad." should be --$\Delta\emptyset = 0.2$ rad.--

Column 8, line 18, "deflection" should be --detection-- line 34, "$V_{d,c} = V_d - V_c = 2\eta S(1'S^2/2R^2)\sin\phi + 2\eta R(\varepsilon + S^2/2R^2)\delta + 2\eta R(\varepsilon - S^2/2R^2) D.$" should be:

--$V_{d,c} = V_d - V_c = 2\eta S(1-S^2/2R^2)\sin\theta + 2\eta R(\varepsilon + S^2/2R^2)\delta + 2\eta R(\varepsilon - S^2/2R^2) D.$--

UNITED STATES PATENT AND TRADEMARK OFFICE
CERTIFICATE OF CORRECTION

PATENT NO. : 4,039,967

DATED : August 2, 1977

INVENTOR(S) : ENGEL ROZA

It is certified that error appears in the above-identified patent and that said Letters Patent are hereby corrected as shown below:

Column 9, line 43, "to point" should be --to a point-- line 57, "ans" should be --and--

Signed and Sealed this

Twenty-second Day of November 1977

[SEAL]

Attest:

RUTH C. MASON
Attesting Officer

LUTRELLE F. PARKER
Acting Commissioner of Patents and Trademarks